(12) United States Patent
Takayama

(10) Patent No.: US 10,341,556 B2
(45) Date of Patent: Jul. 2, 2019

(54) IMAGE CAPTURING APPARATUS AND CONTROL METHOD THEREFOR

(71) Applicant: CANON KABUSHIKI KAISHA, Tokyo (JP)

(72) Inventor: Kazunori Takayama, Hachioji (JP)

(73) Assignee: Canon Kabushiki Kaisha, Tokyo (JP)

( * ) Notice: Subject to any disclaimer, the term of this patent is extended or adjusted under 35 U.S.C. 154(b) by 115 days.

(21) Appl. No.: 15/727,928

(22) Filed: Oct. 9, 2017

(65) Prior Publication Data

US 2018/0109726 A1 Apr. 19, 2018

(30) Foreign Application Priority Data

Oct. 14, 2016 (JP) .................................. 2016-203030

(51) Int. Cl.
| | | |
|---|---|---|
| *H04N 5/235* | (2006.01) | |
| *H04N 5/232* | (2006.01) | |
| *H01L 27/146* | (2006.01) | |
| *H04N 5/225* | (2006.01) | |
| *H04N 5/72* | (2006.01) | |
| *H04N 5/369* | (2011.01) | |
| *H04N 9/04* | (2006.01) | |

(52) U.S. Cl.
CPC ... *H04N 5/23229* (2013.01); *H01L 27/14627* (2013.01); *H04N 5/2258* (2013.01); *H04N 5/232122* (2018.08); *H04N 5/3696* (2013.01); *H04N 5/72* (2013.01); *H04N 9/045* (2013.01)

(58) Field of Classification Search
CPC ............. H04N 5/36961; H04N 5/3696; H04N 5/232133; H04N 5/23212; H04N 5/232127; H04N 5/232123; H04N 5/341; H04N 5/345; H04N 5/3456; H04N 5/347; H04N 5/351; H04N 5/3452; H04N 5/3454

See application file for complete search history.

(56) References Cited

U.S. PATENT DOCUMENTS

| | | | |
|---|---|---|---|
| 2010/0328479 A1* | 12/2010 | Sambongi | ......... H01L 27/14609 348/222.1 |
| 2015/0312485 A1* | 10/2015 | Kitani | .................... H04N 5/243 348/221.1 |

FOREIGN PATENT DOCUMENTS

| | | |
|---|---|---|
| JP | 2004-134867 A | 4/2004 |
| JP | 2007-325139 A | 12/2007 |
| JP | 2012-155095 A | 8/2012 |

* cited by examiner

*Primary Examiner* — Sinh Tran
*Assistant Examiner* — Selam T Gebriel
(74) *Attorney, Agent, or Firm* — Cowan, Liebowitz & Latman, P.C.

(57) ABSTRACT

An image capturing apparatus comprising: an image sensor having a plurality of photoelectric conversion portions that correspond to each of a plurality of microlenses arranged in a matrix; a control circuit that controls read-out from the image sensor by either of first read-out control for obtaining focus detection signals and second read-out control for obtaining an image signal, a setting circuit that sets rows to be read out by the first read-out control among rows that include a focus detection area; an amplification circuit that amplifies a signal with a gain set in accordance with an exposure state; and a signal processing circuit that performs signal processing on an image signal using an image signal of neighboring rows, wherein the setting circuit sets the rows to be read out by the first read-out control according to the gain.

16 Claims, 6 Drawing Sheets

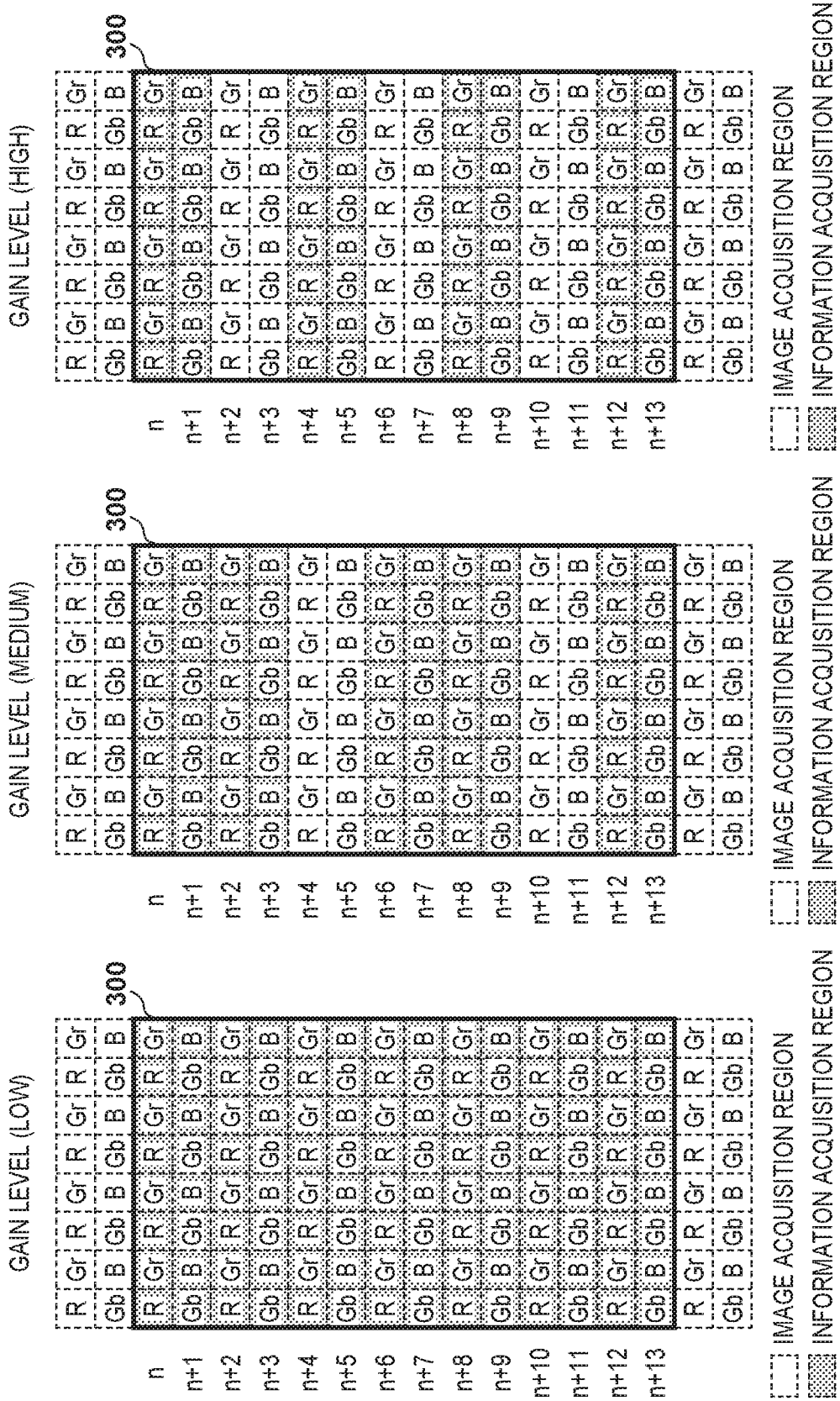

IMAGE CAPTURING APPARATUS AND CONTROL METHOD THEREFOR

BACKGROUND OF THE INVENTION

Field of the Invention

The present invention relates to an image capturing apparatus and a control method therefor, and more particularly to an image capturing apparatus capable of reading a pair of signals from each pixel based on light beams passing through different pupil regions of an optical system and a control method thereof.

Description of the Related Art

Conventionally, there has been known a technique of realizing a focus detection function and image signal acquisition using a single image sensor, and as an example thereof, Japanese Patent Laid-Open No. 2007-325139, which discloses an image sensor having pixels for information acquisition for focus detection that can also serve as pixels for image acquisition for acquiring an image signal, has been proposed. According to this technique, each pixel for the information acquisition is divided into four regions in the horizontal direction and the vertical direction and it is possible to obtain an image signal by adding all the signals of the four divided regions at the time of image acquisition. At the time of focus control, by adding signals of two regions in the horizontal or vertical direction out of the four divided regions, the pupil division of each pixel is realized and the obtained signals can be used as focus adjustment signals for on-imaging plane phase difference focus control.

When reading the signals for the focus control from the image sensor as described above, it is required to read out more pixel signals within a predetermined time, however the load of the system becomes greater due to the increase in the output rate of the image sensor.

In consideration of above, Japanese Patent Laid-Open No. 2012-155095 suggests an image capturing apparatus capable of shortening the time required to read out the image signal from the image sensor while setting the information acquisition region for focus detection in an arbitrary area in the image sensor. In the information acquisition area for focus detection in this image sensor, signals are independently read from a plurality of photoelectric conversion portions of each pixel subjected to pupil division, and the independently read out signals are added in the image capturing apparatus to generate an image signal. On the other hand, in the image acquisition region for acquiring the image signal, the signals of the plurality of photoelectric conversion portions are added for each pixel in the image sensor, then are read out to obtain the image signal.

However, the level of the noise differs between an image signal obtained from the information acquisition region and an image signal obtained from the image acquisition region, and there is a problem that a noise difference between the regions appears in the image.

SUMMARY OF THE INVENTION

The present invention has been made in consideration of the above situation, and makes the difference in noise between the information acquisition area for focus detection and the image acquisition area for image signal acquisition inconspicuous when the on-imaging plane phase difference focus control is performed.

According to the present invention, provided is an image capturing apparatus comprising: an image sensor having a plurality of photoelectric conversion portions that correspond to each of a plurality of microlenses arranged in a matrix; a control circuit that controls read-out from the image sensor by either of a first read-out control and second read-out control, wherein the first read-out control is to read out signals from the plurality of photoelectric conversion portions so as to be able to obtain pupil-divided signals, and the second read-out control is to combine signals of the plurality of photoelectric conversion portions corresponding to each microlens and read out an image signal; a setting circuit that sets rows to be read out by the first read-out control among rows that include a focus detection area for which focus detection is performed; an amplification circuit that amplifies a signal read out from the image sensor with a gain set in accordance with an exposure state; and a signal processing circuit that performs signal processing on an image signal corresponding to each microlens obtained from the signals read out by the first read-out control and on the image signal corresponding to each microlens read out by the second read-out control, using an image signal of neighboring rows, wherein the setting circuit sets the rows to be read out by the first read-out control according to the gain.

Further, according to the present invention, provided is a control method for an image capturing apparatus including an image sensor having a plurality of photoelectric conversion portions that correspond to each of a plurality of microlenses arranged in a matrix, the method comprising: setting rows to be read out by a first read-out control for reading out signals from the plurality of photoelectric conversion portions so as to be able to obtain pupil-divided signals among rows that include a focus detection area for which focus detection is performed; reading out signals from the plurality of photoelectric conversion portions of the image sensor by either of first read-out control and second read-out control for combining signals of the plurality of photoelectric conversion portions corresponding to each microlens and reading out an image signal; amplifying a signal read out from the image sensor with a gain set in accordance with an exposure state; and performing signal processing on an image signal corresponding to each microlens obtained from the signals read out by the first read-out control and on the image signal corresponding to each microlens read out by the second read-out control using an image signal of neighboring rows, wherein the rows to be read out by the first read-out control is set according to the gain.

Furthermore, according to the present invention, provided is a non-transitory storage medium readable by a computer, the storage medium storing a program that is executable by the computer, wherein the program includes program code for causing the computer to perform a control method for an image capturing apparatus including an image sensor having a plurality of photoelectric conversion portions that correspond to each of a plurality of microlenses arranged in a matrix, comprising: setting rows to be read out by a first read-out control for reading out signals from the plurality of photoelectric conversion portions so as to be able to obtain pupil-divided signals among rows that include a focus detection area for which focus detection is performed; reading out signals from the plurality of photoelectric conversion portions of the image sensor by either of first read-out control and second read-out control for combining signals of the plurality of photoelectric conversion portions corresponding to each microlens and reading out an image signal; amplifying a signal read out from the image sensor with a gain set in accordance with an exposure state; and performing signal processing on an image signal corresponding to each microlens obtained from the signals read out by the first read-out control and on the image signal corresponding to each microlens read out by the second read-out control using an image signal of neighboring rows, wherein the rows to be read out by the first read-out control is set according to the gain.

Further features of the present invention will become apparent from the following description of exemplary embodiments (with reference to the attached drawings).

BRIEF DESCRIPTION OF THE DRAWINGS

The accompanying drawings, which are incorporated in and constitute a part of the specification, illustrate embodiments of the invention, and together with the description, serve to explain the principles of the invention.

FIGS. 3A to 3C are diagrams for explaining a relationship between an information acquisition region, an image acquisition region, and filter processing according to the first embodiment;

DESCRIPTION OF THE EMBODIMENTS

Exemplary embodiments of the present invention will be described in detail in accordance with the accompanying drawings.

First Embodiment

Figure 1:
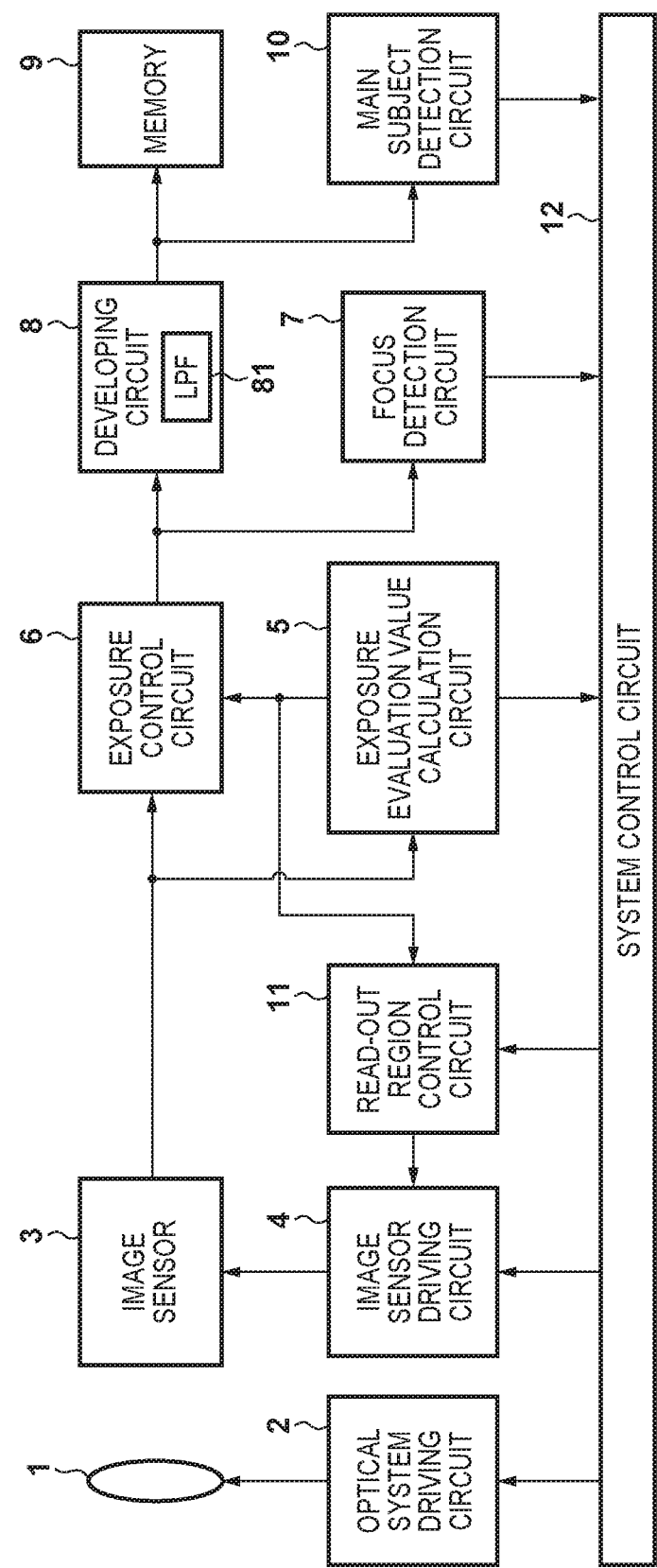
FIG. 1 is a block diagram showing a schematic configuration of an image capturing apparatus according to a first embodiment of the present invention.

FIG. 1 is a block diagram showing a schematic configuration of an image capturing apparatus according to a first embodiment of the present invention. In FIG. 1, an optical system 1 including a zoom lens, a focus lens, and a diaphragm drives the diaphragm and lenses in response to a control signal from an optical system driving circuit 2 to form a subject image controlled to an appropriate brightness onto an image sensor 3. The image sensor 3 has a plurality of photoelectric conversion portions for respectively receiving light fluxes having passed through different regions of an exit pupil of the optical system 1, converting them into electric signals by photoelectric conversion, and outputting pupil-divided image signals. The image sensor 3 is driven by a drive pulse controlled by the image sensor driving circuit 4, and signals are read out so that a pair of pupil-divided focus detection signals can be individually acquired. At this time, from an information acquisition region for acquiring a pair of focus detection signals set as described below in the image sensor 3, pupil-divided electric signals are independently read out from the plurality of photoelectric conversion portions 211a and 211b. On the other hand, from an image acquisition region set for image signal acquisition set as described below, pupil-divided electric signals of the plurality of photoelectric conversion portions 211a and 211b are combined for each pixel in the image sensor 3 and read out. The drive pulse from the image sensor driving circuit 4 is controlled based on parallax image acquisition region information from the read-out region control circuit 11.

Figure 2A:
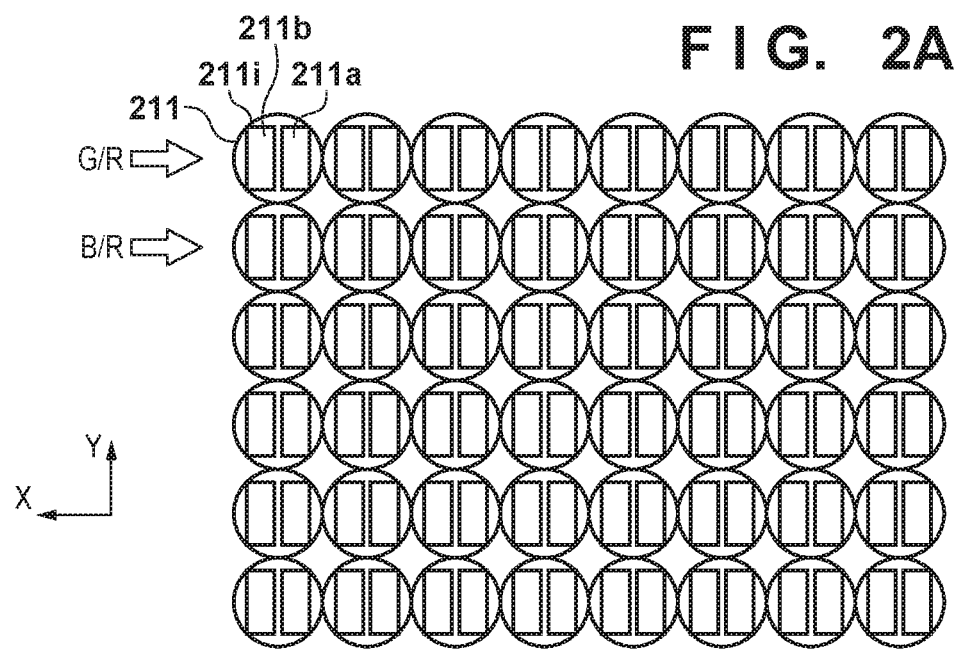
FIG. 2A and FIG. 2B are diagrams showing a configuration example of an image sensor according to an embodiment.

Here, the configuration and reading control of the image sensor 3 will be described with reference to FIGS. 2A and 2B. FIG. 2A shows a pixel array of the image sensor 3 in the present embodiment. The range of 6 rows in the longitudinal direction (Y direction) and 8 rows in the lateral direction (X direction) of the two-dimensional CMOS area sensor is observed from the side of the optical system 1. The image sensor 3 is provided with a Bayer array color filter. In the Bayer array of this embodiment, for example, color filters of green (G) and red (R) are alternately arranged in the X direction in order from the left in the pixels of odd-numbered rows, and color filters of blue (B) and green (G) color filters are alternately arranged in the X direction in order from the left in the pixels of even-numbered rows. In the pixel 211, a plurality of rectangles arranged inside of each on-chip microlens 211i arranged in a matrix form represent photoelectric conversion portions 211a and 211b, respectively.

The photoelectric conversion portions 211a and 211b included in the image sensor 3 of the present embodiment receive light fluxes passing through different partial pupil regions of the optical system 1 and convert them into electric signals. Note that, in the present embodiment, the photoelectric conversion portions of every pixel of the image sensor 3 are divided into two regions in the X direction, and signals can be independently read from the plurality of photoelectric conversion portions 211a and 211b, however, the present invention is not limited to this. For example, a pixel may be divided in the Y direction, or divided into a plurality of portions in the X direction and the Y direction. Then, by adding the readout signals for each pixel, it is possible to obtain an image signal for each pixel. For example, when a signal of the photoelectric conversion portion 211a and a signal of the photoelectric conversion portion 211b are read, an image signal is acquired by adding the signal of the photoelectric conversion portion 211a and the signal of the photoelectric conversion portion 211b. The photoelectric conversion signals of these divided photoelectric conversion portions can be used not only for known phase difference focus detection but also for generating a stereoscopic (3D) image composed of a plurality of images having parallax information. On the other hand, the sum of the two photoelectric conversion signals is used as a normal shot image.

Note that, in the above description, the signal is read out from each of the plurality of photoelectric conversion portions of each pixel of the image sensor 3, but the present invention is not limited to this. For example, it may be configured so that, by reading out a focus detection signal of one of the photoelectric conversion portions 211a and 211b and a signal obtained by combining signals of the photoelectric conversion portions 211a and 211b for each pixel, and subtracting the focus detection signal from the combined image signal, the other focus detection signal is obtained.

Figure 2B:
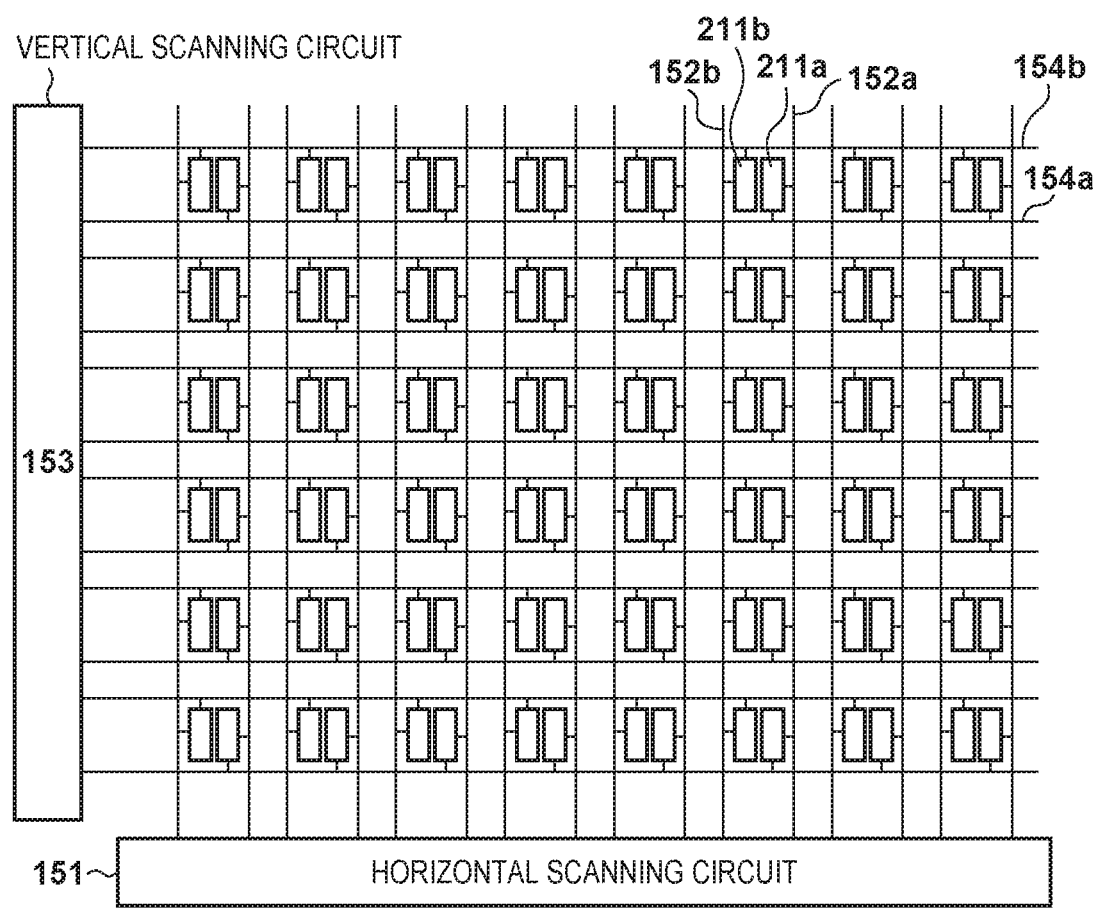

FIG. 2B is a diagram showing a configuration example of a read out circuit of the image sensor 3 according to the embodiment. Reference numeral 151 denotes a horizontal scanning circuit, and reference numeral 153 denotes a vertical scanning circuit. Horizontal scan lines 152a and 152b and vertical scan lines 154a and 154b are arranged at the boundary of each pixel and signals are read out from each of the photoelectric conversion portions 211a and 211b to the outside through these scan lines.

An exposure evaluation value calculation circuit 5 detects an exposure state based on the image signal obtained from the image sensor 3 having the above configuration and controls the aperture so that an appropriate exposure is attained for the entire image. If the brightness is insufficient even when the aperture is fully-opened, a gain is generated so that the image signal has an appropriate brightness and output to an exposure control circuit 6. The exposure control circuit 6 applies the gain received from the exposure evaluation value calculation circuit 5 to the signal output from the image sensor 3 to amplify it, and outputs the amplified signal to a focus detection circuit 7 and a developing circuit 8.

The focus detection circuit 7 performs phase difference AF using a pair of pupil-divided focus detection signals output from the exposure control circuit 6 to obtain a focus state.

In the embodiment, as described above, the light flux that exits from the photographing optical system is pupil divided by the micro lens 211i and the divided photoelectric conversion portions 211a and 211b shown in FIG. 2A. Then, for a plurality of pixels 211 in a predetermined region arranged in the same pixel row, the outputs of the photoelectric conversion portions 211a are combined to form a first focus detection signal (AF image A). Similarly, the outputs of the photoelectric conversion portions 211b are combined to form a second focus detection signal (AF image B). Since the outputs of the photoelectric conversion portions 211a and 211b are outputs of color components of one of a plurality of colors of green, red, blue, and green included in the unit array of the color filter, a pseudo luminance (Y) signal generated by synthesizing these outputs is used. However, the AF image A and the AF image B may be generated for each color of red, blue, and green. The amount of defocus (defocus amount) in a predetermined region can be detected by detecting a relative image shift amount between the AF image A and the AF image B generated in this manner by correlation calculation. Since such an image sensor is well known as disclosed in Japanese Patent Laid-Open No. 2004-134867, a description of further details will be omitted.

The developing circuit 8 includes an LPF 81 with three taps of the same color and generates an image signal of each pixel from the focus detection signal read from the information acquisition region out of the signals output from the exposure control circuit 6. Then, the developing circuit 8 performs low-pass filter (LPF) processing on the generated image signal together with the image signal read out from the image acquisition region. Further, the developing circuit 8 converts the LPF processed image signal into a luminance/color difference signal. The LPF process performed by the LPF 81 will be described below.

As described above, for the information acquisition region, the pupil-divided focus detection signals are independently read out from the photoelectric conversion portions 211a and 211b, and the readout focus detection signals are added in the image capturing apparatus to generate image signals. On the other hand, with regard to the image acquisition region, pupil-divided electric signals from a plurality of photoelectric conversion portions corresponding to each microlens 211i are combined in the image sensor 3 and then read out. The larger the gain from the exposure evaluation value calculation circuit 5 is, the more the noise difference in each unit region in these two regions is emphasized.

On the other hand, the image capturing apparatus usually has a process that refers to peripheral pixels for a pixel of interest like filter processing. For example, in a case where the pixel of interest is included in the information acquisition region and the surrounding pixels are included in the image acquisition region, since the pixel of interest and surrounding pixels are used in the calculation, the noise difference becomes small.

Therefore, in a case where the gain level is high and the noise difference is easy to see, the information acquisition regions are discretely set so that signals of pixels with large noise difference are mixed by calculation to reduce the noise difference. Further, when the gain level is low and the noise difference is difficult to see, the information acquisition region is set continuously, and the focus adjustment of the ordinary phase difference method is performed. This makes it possible to perform the focus adjustment of the phase difference method while making it difficult to see the noise difference between the information acquisition region and the image acquisition region.

The above control will be explained with reference to FIGS. 3A to 3C below. FIGS. 3A to 3C are diagrams showing a part of pixels including the focus detection area indicated by a focus detection frame 300, among the pixels forming the image sensor 3. In the focus detection frame 300, an area not hatched indicates the image acquisition region, and a hatched area indicates the information acquisition regions. The focus detection circuit 7 performs focus detection using the image signal read out from the information acquisition region within the focus detection frame 300. The rows (n+6), (n+8), and (n+10) indicate a reference range of the LPF 81 when a pixel in the row (n+8) is taken as the pixel of interest in the LPF 81 with three taps of the same color in the developing circuit 8. In order to simplify the explanation, the noise here is assumed to be an offset component generated in the reading process of the image sensor 3.

FIG. 3A shows the relationship between the image acquisition region, the information acquisition region, and the rows (n+6), (n+8), and (n+10) when the gain level is low. FIG. 3B shows the relationship between the image acquisition region, the information acquisition region, and the rows (n+6), (n+8), and (n+10) when the gain level is medium. FIG. 3C shows the relationship between the image acquisition region, the information acquisition region, the rows (n+6), (n+8), and (n+10) when the gain level is high.

As shown in FIG. 3A, when the gain level is low, the information acquisition region is continuously set. Under this condition, consider LPF processing with LPF 81 with three taps of the same color. The LPF 81 performs calculation by referring to the pixels of the rows (n+8), (n+10) with the pixel of the row (n+6) as the pixel of interest. Since the rows (n+6), (n+8) and (n+10) are both included in the information acquisition region, the offset component after the LPF process is the same as before the LPF process.

On the other hand, as shown in FIGS. 3B and 3C, in a case where the pixels in the information acquisition region and the pixels in the image acquisition region are referred to upon performing the LPF process, the offset components are mixed and becomes close to the offset component when LPF processing is performed only on the pixels in the image acquisition region. The more pixels in the image acquisition region are mixed with the reference pixels in the LPF process, the closer it is to the offset component when the LPF process is performed on only the pixels in the image acquisition region, and the noise difference between the information acquisition region and the image acquisition region becomes difficult to see.

The luminance/color difference signals LPF processed by the developing circuit 8 as described above are output to a memory 9 and a main subject detection circuit 10. The memory 9 records the luminance/color difference signals from the developing circuit 8 on a recording medium (not shown) or the like.

The main subject detection circuit 10 detects the position of the main subject from the image signal developed by the developing circuit 8 and outputs subject information indicating the position and size thereof to a system control circuit 12. The read-out region control circuit 11 determines the information acquisition region and the image acquisition region based on the position and size of the main subject detected by the main subject detection circuit 10 and the gain from the exposure evaluation value calculation circuit 5, outputs the determined regions to image sensor driving circuit 4. The system control circuit 12 controls entire of the image capturing apparatus.

Figure 4:
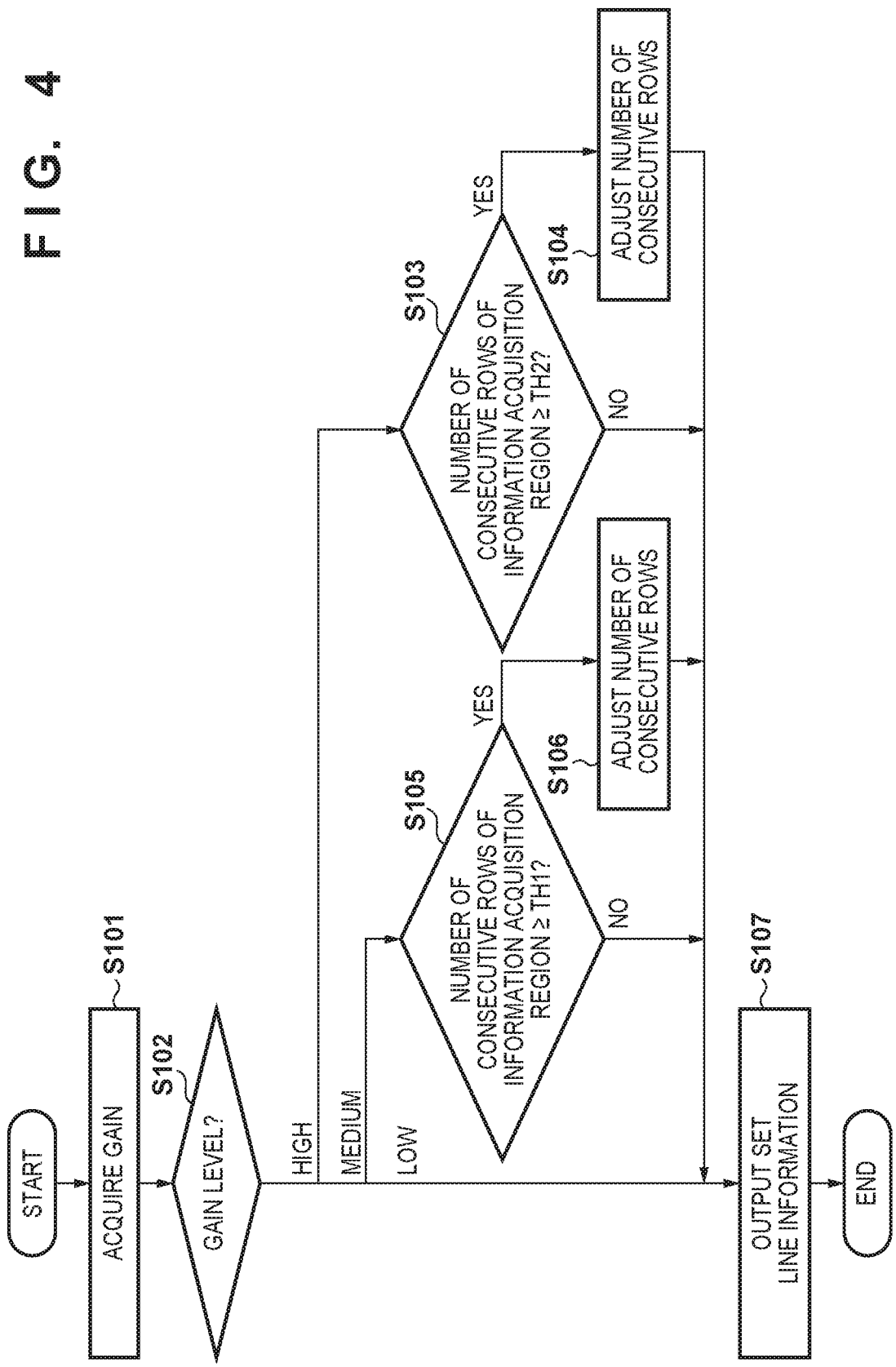
FIG. 4 is a flowchart showing a control operation by a read-out region control circuit in the first embodiment.

Next, the control operation of the read-out region control circuit 11 according to the first embodiment will be described with reference to the flowchart in FIG. 4. In FIG. 4, in S101, the gain generated by the exposure evaluation value calculation circuit 5 is acquired, and the process proceeds to S102. In S102, the generated gain level is compared with a threshold Thg1 and a threshold Thg2 (Thg1>Thg2). If the gain level is larger than the threshold value Thg1, it is judged that the gain level is high, if the gain level is less than or equal to the threshold value Thg1 and is greater than the threshold value Thg2, it is judged that the gain level is medium, and if the gain level is less than the threshold value Thg2, it is judged that the gain level is low. If the gain level is high, the process goes to S103, if the gain level is medium, the process goes to S105, and if the gain level is low, the process goes to S107.

In consideration of the characteristics described above with reference to FIGS. 3A to 3C, in a case where the gain level is high, if the number of consecutive rows of the information acquisition region is equal to or larger than the threshold value Th2 in S103, since the noise difference becomes easy to see, the process proceeds to S104, whereas if the number of consecutive rows of the information acquisition region is smaller than the threshold value Th2, the process proceeds to S107. In S104, the number of consecutive rows of the information acquisition region is adjusted so that the number of consecutive rows of the information acquisition region becomes smaller than the threshold value Th2, and the process proceeds to S107.

On the other hand, in the case where the gain level is medium, in S105, if the number of consecutive rows of the information acquisition region is equal to or larger than a threshold value Th1, since the noise difference becomes easy to see, the process goes to S106, whereas if the number of consecutive rows of the information acquisition region is less than the threshold value Th1, the process proceeds to S107. In S106, the number of consecutive rows of the information acquisition region is adjusted so that the number of consecutive rows of the information acquisition region is smaller than the threshold value Th1, and the process proceeds to S107. Here, in the case where the gain level is high, the noise difference becomes easier to see than in the case where the gain level is medium. Therefore, in order to include more pixels of the image acquisition region in the LPF process, the threshold value is set to Th1>Th2.

In S107, the set line information is outputted to the image sensor driving circuit 4.

According to the first embodiment as explained above, when the gain level is high for which the noise difference is easy to see, the information acquisition region is discretely set and the pixels with large noise difference are mixed by calculation, thereby making the noise difference small. Also, in the case of a low gain level where the noise difference is difficult to see, the information acquisition region is continuously set so as to perform focus adjustment of a normal phase difference method. This makes it possible to perform the focus adjustment of the phase difference method while making it difficult to see the noise difference between the information acquisition region and the image acquisition region.

The line adjustment may be performed using an adjustment value considering the filter reference range. Further, in the first embodiment, the reading in the information acquisition region is changed according to the gain level in the line adjustment, however, the present invention is not limited to this. For example, paying attention to the information acquisition region, the information acquisition region may be set larger as the gain level is higher, and the image acquisition region may be set smaller than the filter reference range so as to reduce the noise difference.

According to the first embodiment as described above, a case of performing the LPF processing is explained. However, the present invention is not limited to this, and the present invention can be applied to signal processing that refers to signals of neighboring rows.

Second Embodiment

Figure 5:
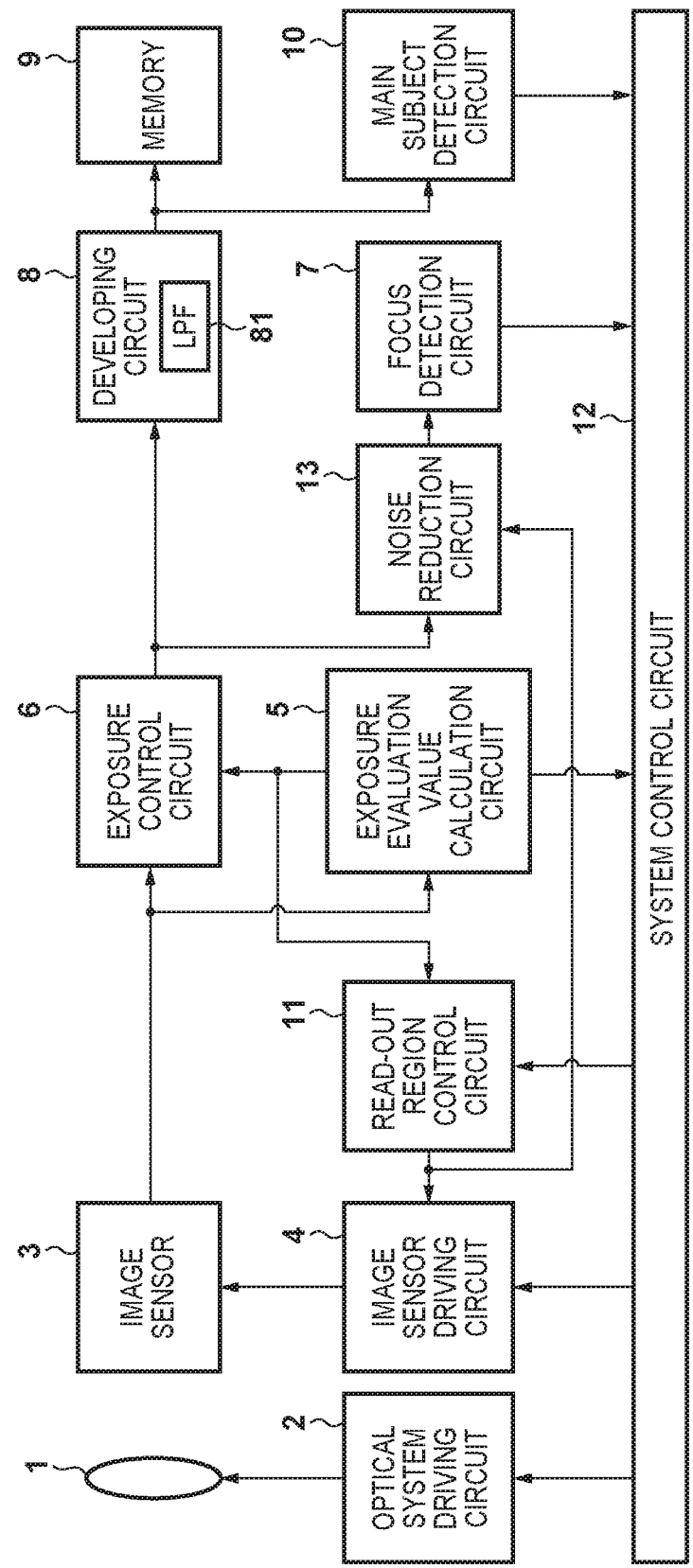
FIG. 5 is a block diagram showing a schematic configuration of an image capturing apparatus according to a second embodiment.

Next, a second embodiment of the present invention will be described. FIG. 5 is a block diagram showing a schematic configuration of an image capturing apparatus according to the second embodiment of the present invention. Compared to the first embodiment, the image capturing apparatus of the second embodiment further has a noise reduction circuit 13 and changes the degree of suppression according to information of the information acquisition region from the read-out region control circuit 11. Since the other configuration is the same as that described in the first embodiment with reference to FIG. 1, the same components are denoted by the same reference numerals, and description thereof will be omitted.

In FIG. 5, the noise reduction circuit 13 suppresses the noise of the focus detection signal based on the image signal from the exposure control circuit 6 and information of the information acquisition region from the read-out region control circuit 11, and outputs the focus detection signal to the focus detection circuit 7.

The focus detection circuit 7 performs focus detection processing with respect to the information acquisition region set in the focus detection frame 300 in FIGS. 3A to 3C. Here, if the number of consecutive rows of the information acquisition region in the focus detection frame 300 decreases according to the gain level, the focus detection is more susceptible to the influence of random noise and accuracy of the focus detection is reduced.

Therefore, although the random noise is suppressed by the noise reduction circuit 13, if the random noise is suppressed when the number of consecutive rows of the information acquisition region is large as in the case where the number of consecutive rows of the information acquisition region is small, the texture of the image is lost, and conversely accuracy of the focus detection lowers.

Figure 6:
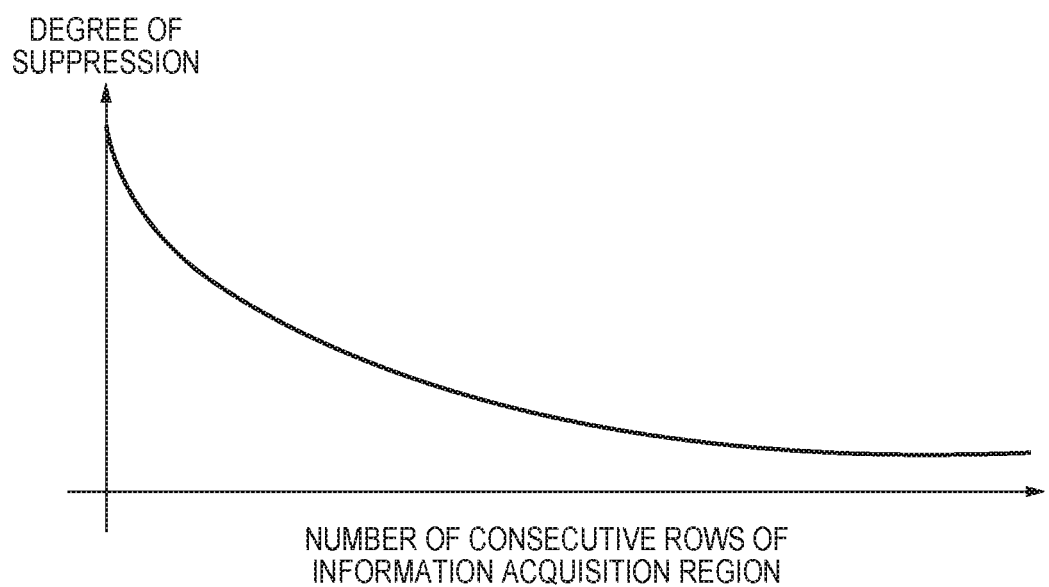
FIG. 6 is a diagram showing a suppression degree of a noise reduction circuit according to the second embodiment.

Therefore, as shown in FIG. 6, by changing the degree of suppression of the noise reduction circuit 13 according to the number of consecutive rows of the information acquisition region, the focus detection accuracy is prevented from being lowered as much as possible.

In FIG. 6, the horizontal axis represents the number of consecutive rows of the information acquisition region, and the vertical axis represents a degree of noise suppression. As shown in FIG. 6, as the number of consecutive rows of information acquisition region decreases, random noise is suppressed by increasing the degree of suppression, and as the number of consecutive rows of the information acquisition region for focus detection increases, the degree of suppression is decreased to prevent the texture of the image from being lost.

According to the second embodiment as described above, by changing the degree of suppression of the noise reduction circuit 13, it is possible to prevent the focus detection accuracy from being lowered as small as possible according to the number of successive rows of the information acquisition region.

According to the second embodiment as described above, the degree of suppression is changed in accordance with the number of consecutive rows of the information acquisition region. However, the degree of suppression may be changed according to the gain level. In that case, the lower the gain level, the lower the degree of suppression should be.

Further, in the graph shown in FIG. 6, it shows that the degree of suppression continuously changes. However, depending upon the number of consecutive rows of the information acquisition region or the gain level, the degree of suppression may be controlled so as to change stepwise by comparing the number of consecutive rows or the gain level with a predetermined threshold value/values.

Other Embodiments

It should be noted that the present invention may be applied to a system constituted by a plurality of devices or to an apparatus comprising a single device.

Embodiment(s) of the present invention can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2016-203030, filed on Oct. 14, 2016 which is hereby incorporated by reference herein in its entirety.

What is claimed is:

1. An image capturing apparatus comprising:
an image sensor having a plurality of photoelectric conversion portions that correspond to each of a plurality of microlenses arranged in a matrix;
a control circuit that controls read-out from the image sensor by either of a first read-out control and second read-out control, wherein the first read-out control is to read out signals from the plurality of photoelectric conversion portions so as to be able to obtain pupil-divided signals, and the second read-out control is to combine signals of the plurality of photoelectric conversion portions corresponding to each microlens and read out an image signal;
a setting circuit that sets rows to be read out by the first read-out control among rows that include a focus detection area for which focus detection is performed;
an amplification circuit that amplifies a signal read out from the image sensor with a gain set in accordance with an exposure state; and
a signal processing circuit that performs signal processing on an image signal corresponding to each microlens obtained from the signals read out by the first read-out control and on the image signal corresponding to each microlens read out by the second read-out control, using an image signal of neighboring rows,
wherein the setting circuit sets the rows to be read out by the first read-out control according to the gain.

2. The image capturing apparatus according to claim 1, wherein the setting circuit discretely sets rows to be read out by the first read-out control in a case where the gain is larger than a predetermined first threshold value.

3. The image capturing apparatus according to claim 2, wherein the setting circuit alternately sets rows to be read out by the first read-out control and rows to be read out by the second read-out control by a predetermined number of rows for each control, and in a case where the gain is greater than a predetermined second threshold value which is larger than the first threshold value, the number of rows to be read out by the first read-out control is set smaller rather than in a case where the gain is less than or equal to the second threshold value.

4. The image capturing apparatus according to claim 2, wherein the setting circuit alternately sets rows to be read out by the first read-out control and rows to be read out by the second read-out control by a predetermined number of rows for each control, and in a case where the gain is equal to or less than the first threshold value, all the rows including the focus detection area are set to be read out by the first read-out control.

5. The image capturing apparatus according to claim 3, wherein the predetermined number of rows is determined based on a number of rows used for the signal processing by the signal processing circuit.

6. The image capturing apparatus according to claim 3, further comprising:

a noise reduction circuit that suppresses noise of a pair of signals having parallax acquired based on the signals read out by the first read-out control; and a focus detection circuit that performs focus detection based on the pair of signals from which noise is suppressed by the noise reduction circuit, wherein, in a case where the predetermined number of rows to be read out by the first read-out control is larger than a predetermined third threshold value, the noise reduction circuit suppresses a degree of suppression more than in a case where the predetermined number of rows to be read out by the first read-out control is smaller than or equal to the third threshold value.

7. The image capturing apparatus according to claim 6, wherein the noise reduction circuit reduces the degree of suppression as the predetermined number of rows to be read out by the first read-out control increases.

8. The image capturing apparatus according to claim 1, further comprising:

a noise reduction circuit that suppresses noise of a pair of signals having parallax acquired based on the signals read out by the first read-out control; and a focus detection circuit that performs focus detection based on the pair of signals from which noise is suppressed by the noise reduction circuit, wherein, in a case where the gain is equal to or less than a predetermined fourth threshold value, the noise reduction circuit suppresses a degree of suppression more than in a case where the gain is greater than the fourth threshold value.

9. The image capturing apparatus according to claim 8, wherein the noise reduction circuit reduces the degree of suppression as the gain decreases.

10. The image capturing apparatus according to claim 1, wherein the signal processing circuit performs low pass filter processing.

11. The image capturing apparatus according to claim 1, wherein the image sensor is covered with a color filter, and the signal processing circuit performs the signal processing using an image signal of the same color of neighboring rows.

12. A control method for an image capturing apparatus including an image sensor having a plurality of photoelectric conversion portions that correspond to each of a plurality of microlenses arranged in a matrix, the method comprising:

setting rows to be read out by a first read-out control for reading out signals from the plurality of photoelectric conversion portions so as to be able to obtain pupil-divided signals among rows that include a focus detection area for which focus detection is performed;

reading out signals from the plurality of photoelectric conversion portions of the image sensor by either of first read-out control and second read-out control for combining signals of the plurality of photoelectric conversion portions corresponding to each microlens and reading out an image signal;

amplifying a signal read out from the image sensor with a gain set in accordance with an exposure state; and performing signal processing on an image signal corresponding to each microlens obtained from the signals read out by the first read-out control and on the image signal corresponding to each microlens read out by the second read-out control using an image signal of neighboring rows, wherein the rows to be read out by the first read-out control is set according to the gain.

13. The control method according to claim 12, wherein rows to be read out by the first read-out control is discretely set in a case where the gain is larger than a predetermined first threshold value.

14. The control method according to claim 13, wherein rows to be read out by the first read-out control and rows to be read out by the second read-out control are alternately set by a predetermined number of rows for each control, noise of a pair of signals having parallax acquired based on the signals read out by the first read-out control is suppressed, focus detection is performed based on the pair of signals from which noise is suppressed, and in a case where the predetermined number of rows to be read out by the first read-out control is larger than a predetermined second threshold value, a degree of suppression is suppressed more than in a case where the predetermined number of rows to be read out by the first read-out control is smaller than or equal to the second threshold value.

15. The control method according to claim 12, wherein noise of a pair of signals having parallax acquired based on the signals read out by the first read-out control is suppressed, focus detection is performed based on the pair of signals from which noise is suppressed, and in a case where the gain is equal to or less than a predetermined third threshold value, a degree of suppression is suppressed more than in a case where the gain is greater than the third threshold value.

16. A non-transitory storage medium readable by a computer, the storage medium storing a program that is executable by the computer, wherein the program includes program code for causing the computer to perform a control method for an image capturing apparatus including an image sensor having a plurality of photoelectric conversion portions that correspond to each of a plurality of microlenses arranged in a matrix, comprising:

setting rows to be read out by a first read-out control for reading out signals from the plurality of photoelectric conversion portions so as to be able to obtain pupil-divided signals among rows that include a focus detection area for which focus detection is performed;

reading out signals from the plurality of photoelectric conversion portions of the image sensor by either of first read-out control and second read-out control for combining signals of the plurality of photoelectric conversion portions corresponding to each microlens and reading out an image signal;

amplifying a signal read out from the image sensor with a gain set in accordance with an exposure state; and performing signal processing on an image signal corresponding to each microlens obtained from the signals read out by the first read-out control and on the image signal corresponding to each microlens read out by the second read-out control using an image signal of neighboring rows, wherein the rows to be read out by the first read-out control is set according to the gain.

* * * * *